United States Patent [19]

Womack et al.

[11] Patent Number: 4,713,678

[45] Date of Patent: Dec. 15, 1987

[54] dRAM CELL AND METHOD

[75] Inventors: Richard H. Womack, Dallas; Sanjay K. Banerjee, Richardson; Hisashi Shichijo; Satwinder Malhi, both of Garland, all of Tex.

[73] Assignee: Texas Instruments Incorporated, Dallas, Tex.

[21] Appl. No.: 928,717

[22] Filed: Nov. 13, 1986

Related U.S. Application Data

[63] Continuation of Ser. No. 679,162, Dec. 7, 1984, abandoned.

[51] Int. Cl.$^4$ .................. H01L 29/78; H01L 27/02; H01L 29/06; H01L 29/04
[52] U.S. Cl. ........................ 357/23.6; 357/23.4; 357/41; 357/45; 357/51; 357/55; 357/59
[58] Field of Search .................. 357/23.4, 23.6, 41, 357/45, 51, 55, 59

[56] References Cited

U.S. PATENT DOCUMENTS

| | | | |
|---|---|---|---|
| 3,836,998 | 9/1974 | Rocsis et al. | 357/49 |
| 3,961,355 | 6/1976 | Abbas et al. | 357/23.6 |
| 4,199,772 | 4/1980 | Natori et al. | 357/23 |
| 4,272,880 | 6/1981 | Pashley | 357/23.7 |
| 4,353,086 | 10/1982 | Jaecodene et al. | 357/51 |
| 4,396,930 | 8/1983 | Mizutami | 357/23 |
| 4,403,241 | 9/1983 | Butherus et al. | 357/55 |
| 4,432,006 | 2/1984 | Takei | 357/23 |
| 4,462,040 | 7/1984 | Ho et al. | 357/23 |

FOREIGN PATENT DOCUMENTS

| | | | |
|---|---|---|---|
| 0108390 | 5/1984 | European Pat. Off. | 357/23.6 |
| 57-45947 | 3/1982 | Japan | 357/23.6 |
| 57-109367 | 8/1982 | Japan | 357/23.7 |
| 58-3269 | 10/1983 | Japan | 357/23.6 |
| 58-213464 | 12/1983 | Japan | 357/23.6 |
| 59-19366 | 1/1984 | Japan | 357/23.6 |
| 59-181661 | 10/1984 | Japan | 357/23.6 |
| 084937 | 9/1967 | United Kingdom | 357/23.4 |

OTHER PUBLICATIONS

S. Nakajima et al, "An isolated-merged vertical capacitor cell for large capacity DRAM", *IEDM 84*, pp. 240–243, (1984).

D. M. Kenney, "Reduced bit line capacitance in VMOS devices", *IBM Technical Disclosure Bulletin*, vol. 23 (1981), pp. 4052–4053.

D. M. Kenney, "V-groove dynamic memory cell", *IBM Technical Disclosure Bulletin*, vol. 23 (1980), pp. 967–969.

T. S. Chang et al., "Vertical FET random-access memories with deep trench isolation", *IBM Technical Disclosure Bulletin*, vol. 22 (1980), pp. 3683–3687.

H. S. Lee et al., "Short-channel field-effect transistors in V-grooves", *IBM Technical Disclosure Bulletin*, vol. 22 (1980), pp. 3630–3634.

T. S. Chang et al., "Fabrication of V-MOS random-access memory cells with a self-aligned word line", *IBM Technical Disclosure Bulletin*, vol. 22 (1979), pp. 2768–2771.

F. Barson, "Dynamic DMOS random-access memory cell design with trench", *IBM Technical Disclosure Bulletin*, vol. 21 (1978), pp. 2755–2756.

J. J. Fatula, "N skin elimination in UMOS device by re-oxidation", *IBM Technical Disclosure Bulletin*, vol. 22 (1980), pp. 3204–3205.

Primary Examiner—J. Carroll
Attorney, Agent, or Firm—Douglas A. Sorensen; Leo N. Heiting; Melvin Sharp

[57] ABSTRACT

A dRAM cell and array of cells, together with a method of fabrication, are disclosed wherein the cell includes one field effect transistor and one storage capacitor with the capacitor formed in a trench in a substrate and the transistor channel formed by epitaxial growth on the substrate. The transistor source and drain are insulated from the substrate, and the transistor may be adjacent the trench or on the upper portion of the trench sidewalls. Signal charge is stored on the capacitor plate insulated from the substrate.

10 Claims, 11 Drawing Figures

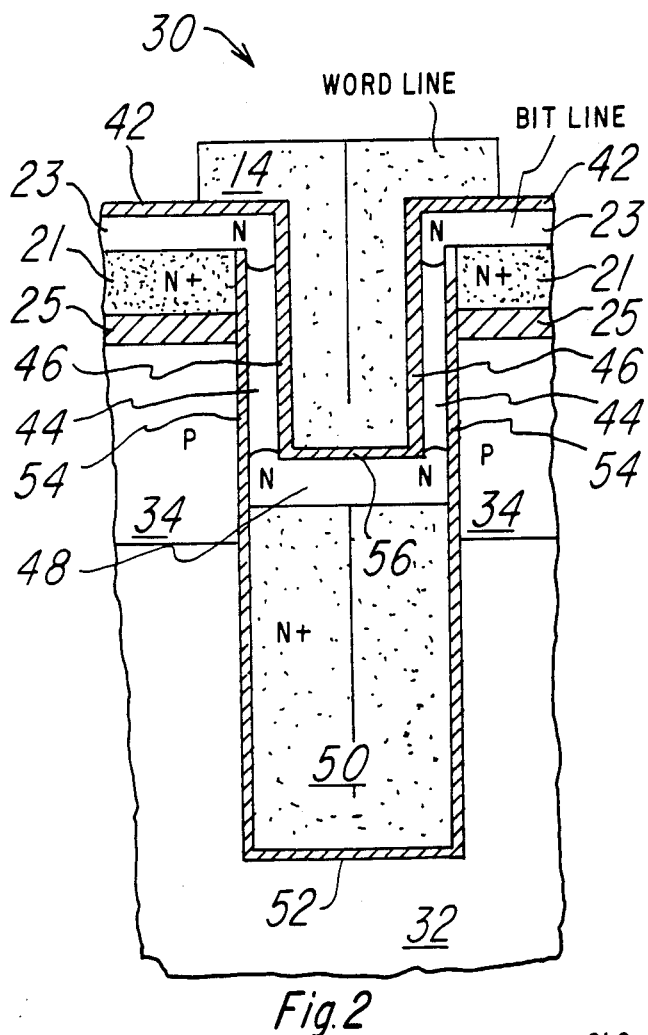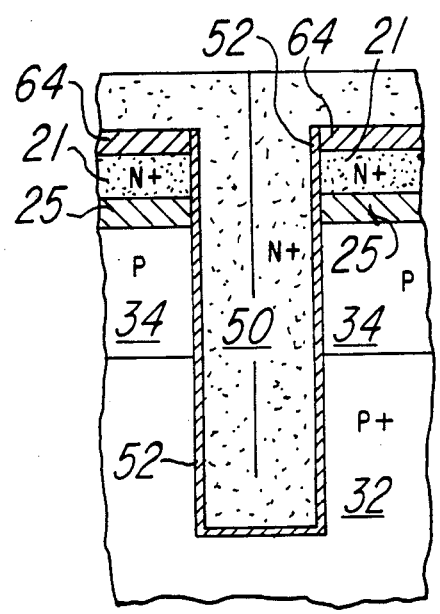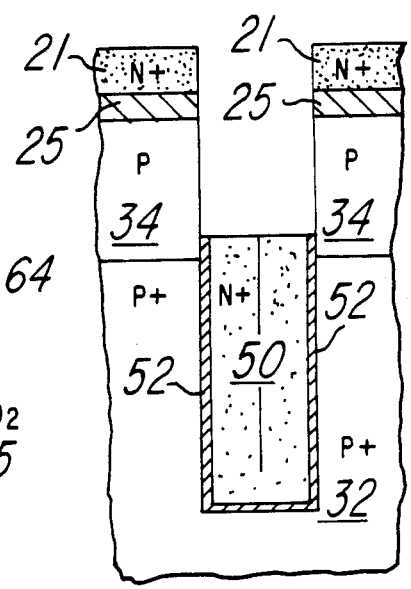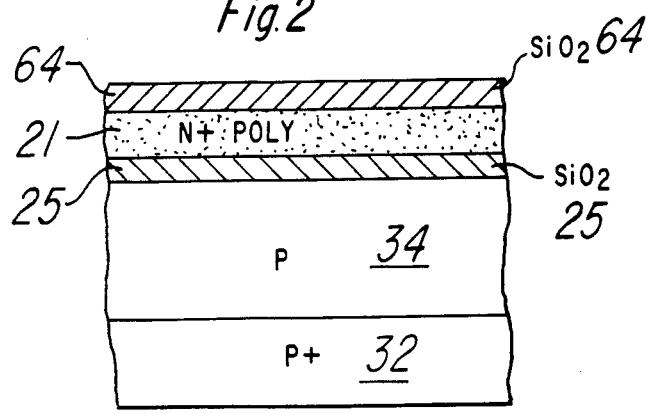

dRAM CELL AND METHOD

This application is a continuation, of application Ser. No. 679,162, filed Dec. 7, 1984, abandoned.

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtoccoulombs of hazardous electrons), noise injected from the substrate, pn junction leakage over the entire area of the capacitor, and subthreshold leakage of the cell transistor. A typical stored charge in a dRAM cell is 250 fC. For a five volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev.Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since ground electrodes both above and below are separated from the storage region in the recrystallized polysilicon by capacitor insulator oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor. Further, beam recrystallization distrubs underlying structures and is not a simple, established process.

A second approach to shrinking dRAM cell size relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MS Memories, 4 IEEE Elec.Dev.Lett. 90 (1983); and K. Itoh et al, An Experimental 1Mb DRAM with On-Chip Voltage Limiter, 1984 IEEE ISSCC Digrest of Tech Papers 282. The corrugated capacitor extends about 2.5 microns into the silicon substrate. Fabrication proceeds as follows: Trenches are formed ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E. Arai, Submicron MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec.Dev.Lett. 411 (1983) all describe a cell with a traditional design except for the capacitor which has been changed from plates parallel to the substrate to plates on the walls of a trench in the substrate. Such a trench capacitor permits large capacitance per unit area of substrate by simply using a deep trench. The capacitors described in these articles were fabricated as follows: Starting with (100) oriented, p-type, 4–5 ohm-cm resistivity silicon substrates, trench patterns with 0.4–1.0 micron width were formed by electron-beam direct writing. Trenches of 1–3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorus diffused into the trench surface layers, and the PSG etched away by hydofluoric acid. $SiO_2$ of 150–500 A was grown in dry $O_2$ or CVD $Si_3N_4$ was deposited 500 A thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area. However, the cell transistor in these trench capacitor cell is formed in the bulk substrate adjacent to the capacitor and is not isolated as in the first approach.

The use of trenches for isolation is also well known and has been extensively studied; for example, R. Rung et al, Deep Trench isolated CMOS Devices, IEEE IEDM Tech Digest 237 (1982); K. Cham et al, A Study of the Trench Inversion Problem in the Trench CMOS Technology, 4 IEEE Elec.Dev.Let. 303 (1983); A. Hayasaka et al, U-Groove Isolation Technique for High Speed Bipolar VLSI's, IEEE Tech Digest 62 (1982); H.

Goto et al, An Isolation Technology for High Performance Bipolar Memories—IOP-II, IEEE IEDM Tech Digest 58 (1982); T. Yamaguchi et al, High-Speed Latchup-Free 0.5-um-Channel CMOS Using Self-Aligned $TiSi_2$ and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology. IEEE IEDM Tech Digest 23 (1983). These isolation trenches are formed in a manner similar to that described for the trench and corrugated capacitors; namely, patterning (typically with oxide mask), RIE with $CBrF_3$, $CCl_4$, $Cl_2$-$H_2$, $CCl_4$-$O_2$, etc. excavation, thermal oxidation (plus LPCVD nitride) of the sidewalls, and filling with polysilicon.

However, the beam recrystallized cell occupies too much substrate area and the trench capacitor cells fail to isolate the transistor and capacitor storage plate from the substrate. And all of these cells do not minimize the substrate area occupied.

SUMMARY OF THE INVENTION

The present invention provides a one-transistor dRAM cell structure, array of cells and fabrication method in which the cell transistor has an epitaxially grown channel formed adjacent or on the sidewalls of a substrate trench containing the cell capacitor; the trenches are located under the crossings of word and bit lines of the array. The stacking of the transistor on top of the capacitor in a trench yields minimal cell area on the substrate and solves the problem of dense packing of dRAM cells. Further, an epitaxially grown channel formed adjacent the trench may be insulated from the substrate and the capacitor plate storing the cell charge is insulated from the substrate, thereby solving the isolation problems.

In one preferred embodiment, the transistor gate is polysilicon inserted into the upper portion of the trench, and the capacitor is formed with the charge storing plate being polysilicon inserted into the lower portion of the trench and the other plate being the sidewalls of the trench.

In other preferred embodiments, the transistor channel is formed on the substrate surface adjacent the trench and may be insulated from the substrate by having the epitaxial growth seeded from an opening in the insulator away from the channel.

BRIEF DESCRIPTION OF THE DRAWINGS

FIG. 2 is a schematic cross sectional elevation of a first preferred embodiment dRAM cell taken along line 2—2 of FIG. 1B;

FIGS. 3A-E illustrate a sequence of process steps of a first preferred embodiment method of fabrication of the first preferred embodiment dRAM cell.

DESCRIPTION OF THE PREFERRED EMBODIMENTS

Figure 1A:
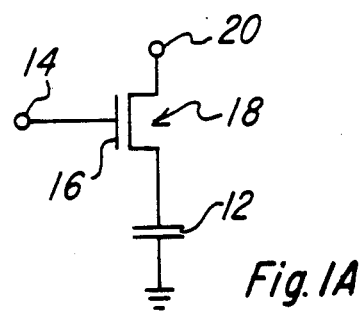
FIGS. 1A-B are the schematic equivalent circuit and local memory array geometry for a first preferred embodiment dRAM cell and array.

The preferred embodiment dRAM cells are one transistor/one capacitor cells connected to bit and word lines as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operations. Leakage currents and other sources of decay of the charge on capacitor 12 necessitate periodic refreshing of the charge, and thus the name dynamic RAM (dRAM).

Figure 1B:
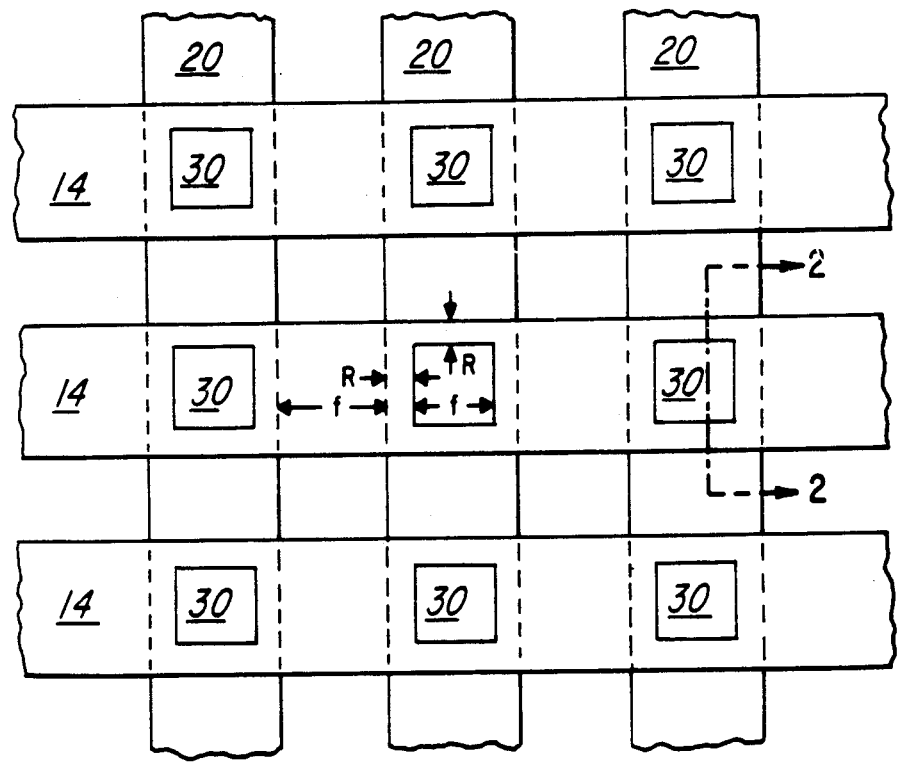
Figure 3D:
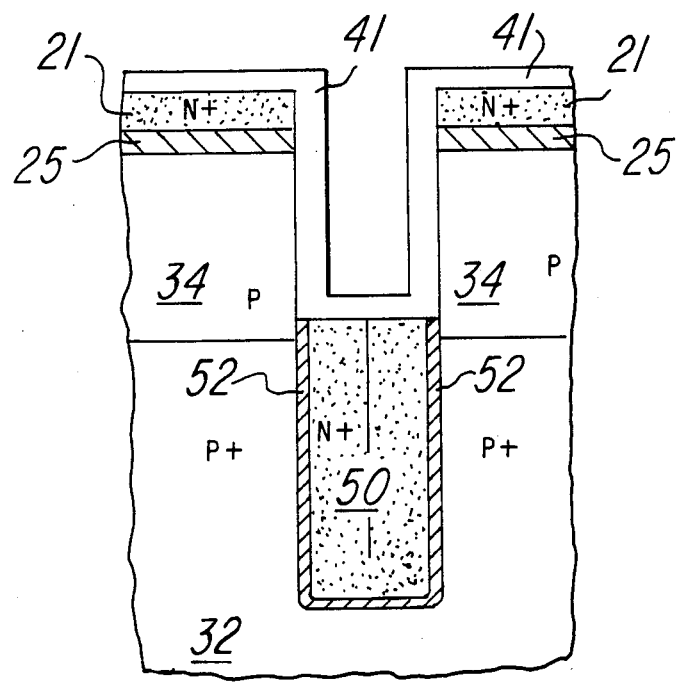
Figure 3E:
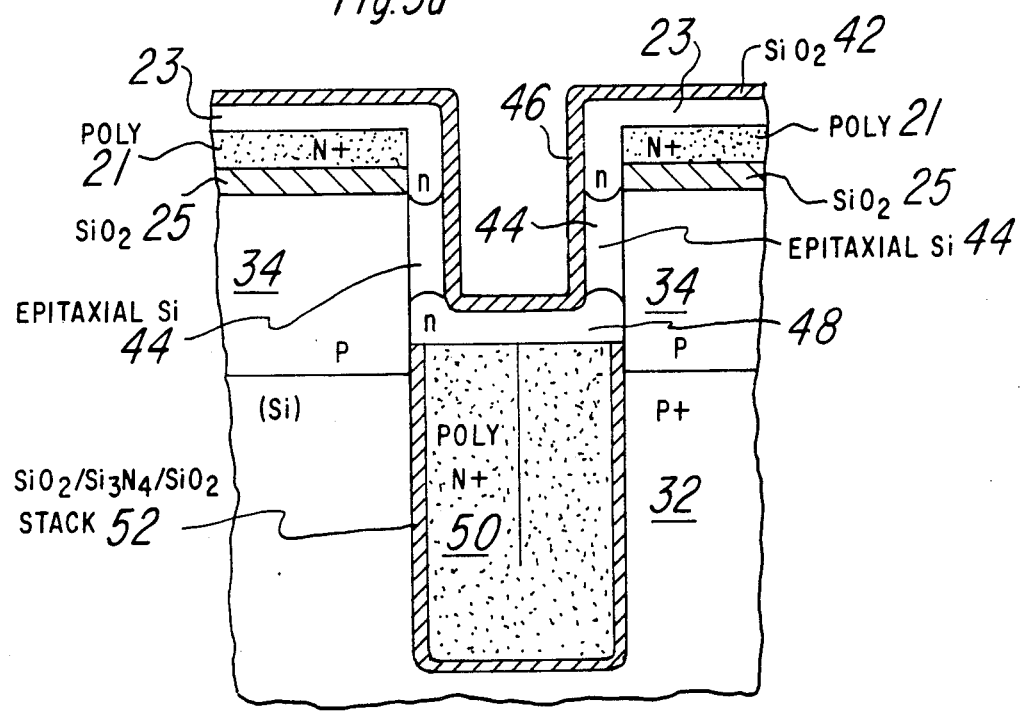

FIG. 1B is a plan view showing a portion of a dRAM array of bit lines 20 and word lines 14 with preferred embodiment cells 30 at the intersections of the lines; note that bit lines 20 pass under word lines 14. The cells extend down into the substrate below the lines and provide a maximal density memory. If the minimum feature size is denoted by f and the minimum registration is denoted by R, then the cell area is $[2(f+R)]^2$. For example, with a minimum feature size of 1.0 micron and a minimum registration tolerance of 0.25 micron, the cell area is about 6.25 square microns.

FIG. 2 is a cross sectional elevation of a first preferred embodiment dRAM cell, generally denoted 30. Cell 30 is formed in p+ silicon substrate 32 with p epilayer 34 and includes n+ polysilicon word line 14, bit line 20 consisting of n+ buried polysilicon layer 21 plus n layer 23, bit line isolation oxide 25, bit line insulator oxide 42, transistor 18 channel 44, transistor 18 gate oxide 46, n region 48 which forms the source for transistor 18, n+ polysilicon region 50 which forms one of the plates of capacitor 12 with p+ substrate 32 forming the other and ground plate, oxide/nitride/oxide stack 52 which forms the insulator between the plates of capacitor 12, and insulating oxide 56. The view of cell 30 in FIG. 2 corresponds to a section along vertical line 2—2 in FIG. 1B; the square cross section of the trench containing capacitor 12 and transistor 18 is apparent in FIG. 1B.

In cell 30 capacitor 12 is formed with one of its plates being n+ region 50 plus n region 48 and the other plate being substrate 32 plus epilayer 34; however, the doping of epilayer 34 is much lower than that of p+ substrate 32, so the capacitance of the n/p junction of region 48 and epilayer 34 and the capacitance of the n+ region 50/stack 52/p epilayer 34 are both much less than the capacitance of n+ region 50/stack 52/p+ substrate 32 and may be ignored. Also, as will be described below, the plate area of epilayer 34 is small compared to that of substrate 32, and this further implies the insignificance of the epilayer 34 capacitance. For a trench with a one micron by one micron cross section and a five micron depth, the capacitor 12 plate are a would be about 17 square microns if one micron of the depth is occupied by epilayer 34 and bit line 20. P+ substrate 32 is the ground common to all cells 30 in the array illustrated in FIG. 1B.

Transistor 18 in cell 30 has a channel region 44 epitaxially grown on epilayer 34, and source region 48 (which is also a part of a plate of capacitor 12) and drain region 23, (which is also part of bit line 20) which are partially recrystallized near channel region 44, as described below. Consequently, transistor 18 will have bulk transistor characteristics which are known to be adequate for speed and refresh specifications.

Isolation oxide 25 is fairly thick and reduces the bit line 20 capacitance and serves as isolation of the bit line to decrease susceptibility to noise generated as a result of a substrate bump or an alpha particle. Further, signal charge is stored in n+ polysilicon 50 and is isolated from substrate 32 by stack 52 and thus is more immune to noise generated by alpha particles. Further, the bit lines and signal charge are also more immune to any temporary conduction paths between them and other cells that might be created by an alpha particle track.

The dimensions and materials characteristic of cell 30 are best understood in connection with the following description of the process steps of a first preferred embodiment method of fabrication; FIGS. 3A–E illustrate the sequence of process steps.

1. (100) oriented p+ silicon substrate 32 of resistivity less than 1E-2 ohm-cm has a p epilayer 34 grown with a carrier concentration of 2E16/cm3 and thickness such that after all thermal processing and its diffusions, the final p epilayer 34 thickness is 2.0 microns. Oxide layer 25 is grown to a thickness of 2000A; and n+ polysilicon layer 21 is deposited by LPCVD to a thickness of 3000A and a carrier concentration of 1E20/cm3. One micron of plasma enhanced CVD oxide 64 is then deposited; see FIG. 3A.

2. Oxide 64 is patterned to define the one micron square trenches, and the patterned oxide is then used as the mask for RIE with HCl excavation of the trenches to a depth of six microns. The trench walls and bottom are cleaned of RIE damage and contamination with a wet acid etch, and stack 52 then formed on the sidewalls and bottom as follows: oxide is thermally grown to a thickness of 100A, then an LPCVD deposition of nitride to a thickness of 75A is performed, and the nitride is thermally oxidized to improve the dielectric integrity; this yields the oxide/nitride/oxide stack 52. The trench is then filled with n+ doped polysilicon 50; see FIG. 3B.

3. Polysilicon 50 is planarized, such as with spun on photoresist, and plasma etched completely away on the surface and down into the trench to just above the interface between epilayer 34 and substrate 32. As will be seen below, the location of the top of polysilicon 50 is not crucial. The exposed portion of stack 52 is stripped along with oxide layer 64; see FIG. 3C.

4. 2000A thick layer of 1–2 ohm-cm silicon epilayer 41 is deposited (alternatively, layer 41 may be polysilicon which is amorphized by silicon implants and then converted to single crystal by solid phase epitaxy at low temperatures such as 600 degrees C.; or polysilicon 41 may be directly recrystallized at high temperature, such as 1100 degrees C.). Of course, the crystal structure of layer 41 is expected to have various faults away from the portion adjacent epilayer 34 because it is being deposited over polysilicon 50 or polysilicon 21. Such faults are not significant because the portion of layer 41 adjacent epilayer 34 will become the channel of transistor 18 and thus is the only portion required to be single crystal; see FIG. 3D.

5. Outdiffusion of then-type dopant from n+ polysilicon 21 dopes region 23 n type, and outdiffusion of the n-type dopant from n+ polysilicon 50 dopes region 48 n type. Oxides 42, 46, and 56 are now grown on regions 23, 44, and 48, respectively. Note that the oxide grows thicker over the doped regions 23 and 48 than over the undoped region 44; the thickness of the oxide is determined by the desired thickness of gate oxide 46, which is 250A in cell 30. See FIG. 3E.

6. Lastly, n+ polysilicon 14 is deposited and patterned to form wordlines 14; see FIG. 2 for the completed cell.

Figure 4A:
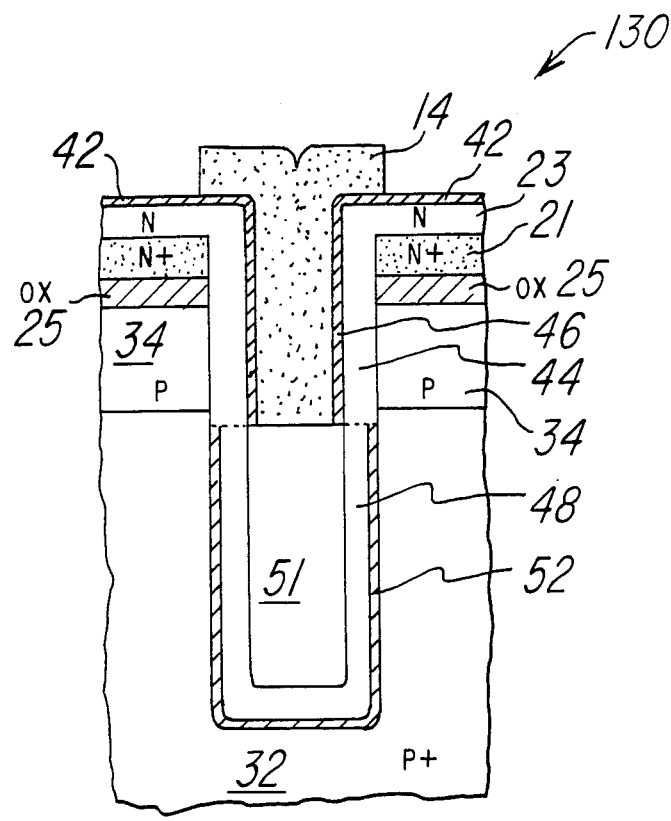
FIGS. 4A-C illustrate second, third and fourth preferred embodiment dRAM cells.

A second preferred embodiment cell, generally denoted 130, is illustrated in FIG. 4A and includes a layer of polysilicon which forms the source 48, channel 44, and drain 23 of transistor 18 (channel 44 is converted to single crystal silicon by solid phase epitaxy). Cell 130 also has capacitor 12 insulator 52, PSG 51 filling the lower portion of the trench and providing a source of dopants for doping phosphorus source 48, gate oxide 46, and polysilicon word line 14 which also acts as the gate for transistor 18.

Figure 4B:
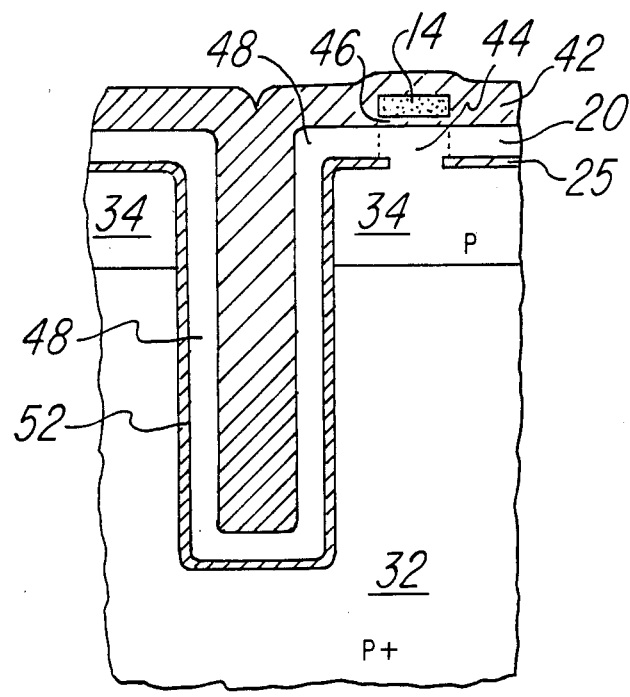

FIG. 4B illustrates another application of the formation of the channel of transistor 18 by epitaxy with a portion of the substrate (or epilayer) as seed through a hole in the insulator. In the cell of FIG. 4B the transistor is formed beside the trench, and the cell density is not as great as with cells 30 and 130.

Figure 4C:
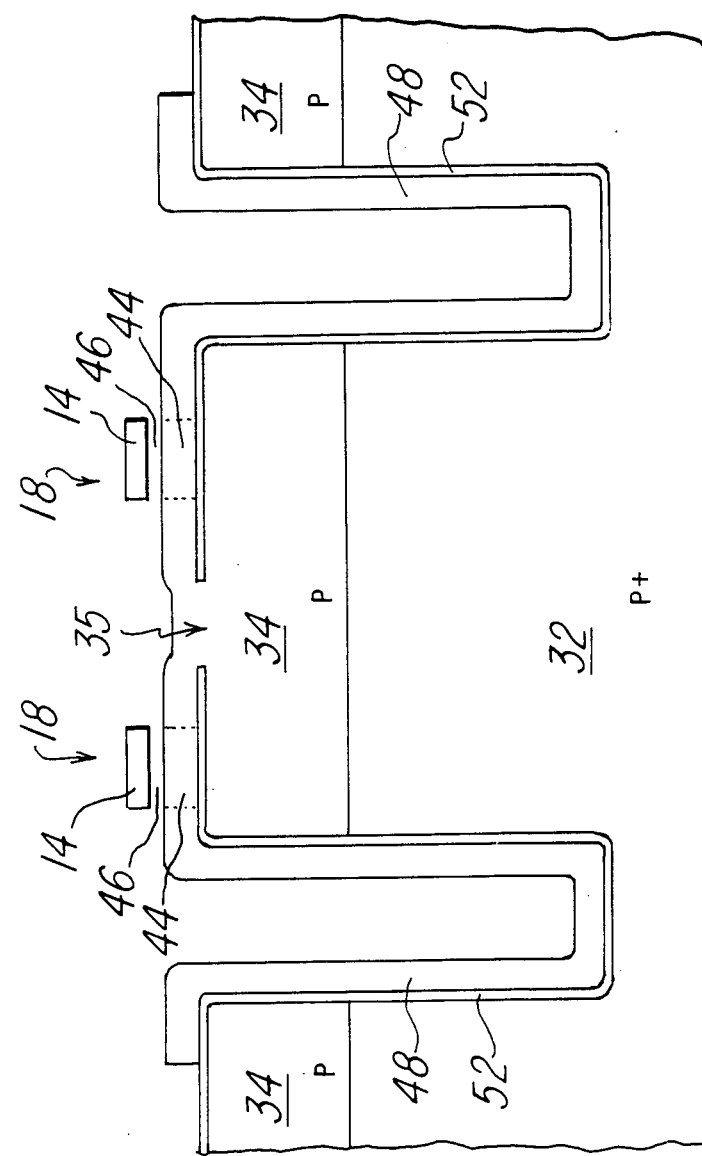

FIG. 4C shows another application with channel 44 of transistor 18 formed epitaxial lateral overgrowth during CVD of polysilicon 48, the seed for the epitaxy is substrate 34 through hole 35 in insulator 52. Note that the seed is not in contact with channel 44 (this contrasts with the application in FIG. 4B) and allows the possibility of completing the isolation of the bit line and other features at a later stage in the process.

Many modifications of the preferred embodiments are available which still fall within the scope of the invention in that such modifications either singly or in combinations, do not disrupt the storage of signal charge by the capacitor nor the on/off function of the transistor. Such modifications include the following:

The trench cross section could be whatever shape is convenient, such as circular, rectangular, arbitrary convex corrugated, even multiconnected and could even vary along the vertical, continuously or in steps or both. Similarly, the trench sidewalls need not be vertical, rather any geometry that can be processed should work to a greater or lesser extent, such as bulging, tapered, and sloped sidewalls; indeed, any simply connected trench is homeomorphic to the parallelepiped of the preferred embodiment. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetra.

The capacitor insulator can be of any convenient material such as oxide, nitride, oxide-nitride, oxide-nitride-oxide, and other stack combinations, and the oxide could be thermally grown, LPCVD, grown dry or in steam, and so forth. The thickness of the insulator is a tradeoff of process convenience, insulator reliability, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitor insulator will be a corresponding material. Similarly, amorphous silicon could be used in place of polysilicon.

The transistor can be formed to operate with a variety of threshold voltages by adjusting the threshold voltage (such as by a shallow diffusion on the channel just prior to gate oxide growth or deposition), in the accumulation or inversion mode, and as n-channel or p-channel device. The doping levels and the doping species can be varied so as to vary the transistor characteristics. Note that the transistor channel length for the embodiments with transistor in the trench is determined approximately by trench depth and channel width and is roughly equal to the trench perimeter.

The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, and so forth.

We claim:

1. A memory cell array on a substrate comprising:
   a plurality of parallel first conductor lines on said substrate;
   a plurality of parallel second conductor lines crossing said first conductor lines but insulated therefrom; and
   a plurality of cells one cell at each of said crossings each of said cells including:
   a conductive region formed in a trench formed in said substrate below said crossings, said conductive region being insulated from said substrate;
   an epitaxial layer formed in the portion of said trench not occupied by said conductive region, said epitaxial layer including a source region in contact with said conductive region, a drain region connected to one of said first conductor lines, and a channel region between said source and drain regions in contact with said substrate;
   a gate formed adjacent to said channel region but insulated from said channel region, said gate connected to one of said second conductor lines.

2. A memory cell array as in claim 1 wherein said channel region forms a cylinder along the walls of said trench.

3. A memory cell array as in claim 1 wherein the portion of said substrate surrounding said conductive region is high conductivity crystalline semiconductor; and and
   wherein the portion of said substrate surrounding the remainder of said trench is low conductivity crystalline semiconductor material.

4. A memory cell array as in claim 1 wherein said conductive material comprises polycrystalline silicon.

5. A memory cell array as in claim 1 wherein said trench is cylindrical trench with its major access perpendicular to the surface of said substrate.

6. A memory cell in a substrate comprising:
   a conductive region formed in a trench formed in said substrate, said conductive region being insulated from said substrate;
   an epitaxial layer formed in the portion of said trench not occupied by said conductive region, said epitaxial layer including a source region in contact with said conductive region, a drain region, and a channel region between said source and drain regions in contact with said substrate;
   a gate formed adjacent to said channel region but insulated from said channel region.

7. A memory cell array as in claim 6 wherein said channel region forms a cylinder along the walls of said trench.

8. A memory cell array as in claim 6 wherein the portion of said substrate surrounding said conductive region is high conductivity crystalline semiconductor; and
   wherein the portion of said substrate surrounding the remainder of said trench is low conductivity crystalline semiconductor material.

9. A memory cell array as in claim 6 wherein said conductive material comprises polycrystalline silicon.

10. A memory cell array as in claim 6 wherein said trench is a cylindrical trench with its major access perpendicular to the surface of said substrate.

* * * * *